(12) United States Patent
Ouellet et al.

(10) Patent No.: US 7,927,904 B2
(45) Date of Patent: Apr. 19, 2011

(54) METHOD OF MAKING BIOMEMS DEVICES

(75) Inventors: Luc Ouellet, Granby (CA); Stephane Martel, La Prairie (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 0 days.

(21) Appl. No.: 12/651,561

(22) Filed: Jan. 4, 2010

(65) Prior Publication Data
US 2010/0173436 A1 Jul. 8, 2010

Related U.S. Application Data

(60) Provisional application No. 61/142,543, filed on Jan. 5, 2009.

(51) Int. Cl.
*H01L 21/8238* (2006.01)
(52) U.S. Cl. ............ 438/50; 438/51; 257/E21.632
(58) Field of Classification Search ............ 438/50, 438/51
See application file for complete search history.

(56) References Cited

U.S. PATENT DOCUMENTS

| 5,705,018 | A | 1/1998 | Hartley |
| 6,117,643 | A | 9/2000 | Simpson et al. |
| 6,131,410 | A | 10/2000 | Swierkowski et al. |
| 6,167,910 | B1 | 1/2001 | Chow |
| 2007/0148588 | A1* | 6/2007 | Park et al. ............ 430/270.1 |
| 2008/0210933 | A1* | 9/2008 | Meng .................... 257/40 |

OTHER PUBLICATIONS

"Capacitance Cytometry: Measuring Biological Cells One by One", L.L. Sohn et al., Department of Physics and Molecular Biology, Princeton University, Princeton, NJ, 08544, Sep. 26, 2000, vol. 97, No. 20, p. 10687-10690.

* cited by examiner

*Primary Examiner* — Alexander G Ghyka
(74) *Attorney, Agent, or Firm* — Marks & Clerk; Richard J. Mitchell

(57) ABSTRACT

A MEMS device is manufactured by first forming a self-aligned monolayer (SAM) on a carrier wafer. Next, a first polymer layer is formed on the self-aligned monolayer. The first polymer layer is patterned form a microchannel cover, which is then bonded to a patterned second polymer layer on a device wafer to form microchannels. The carrier wafer is then released from the first polymer layer.

14 Claims, 6 Drawing Sheets

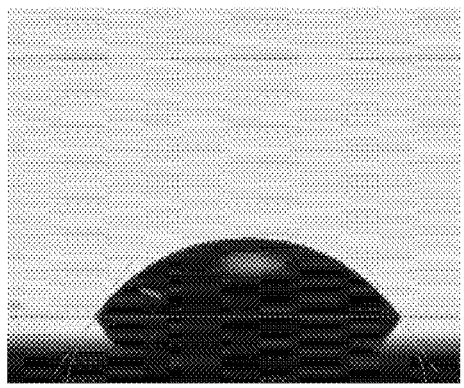
Fig. 1A
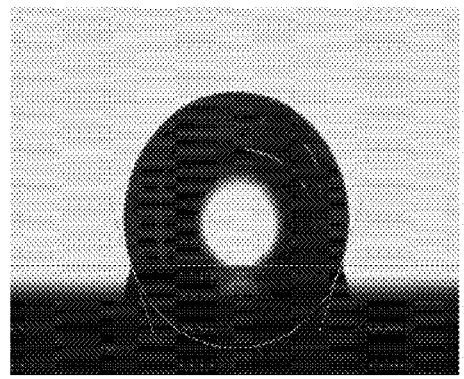
Fig. 1B
Fig. 2
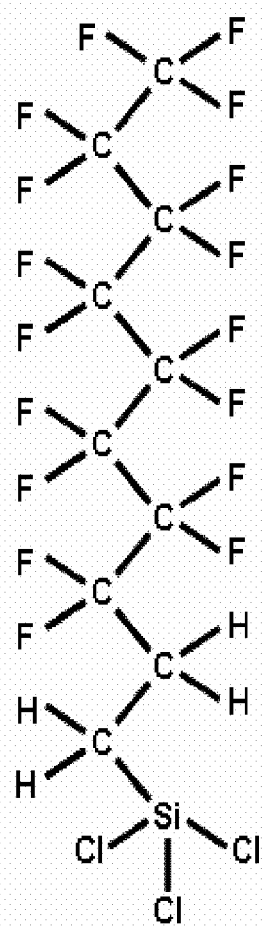

METHOD OF MAKING BIOMEMS DEVICES

CROSS REFERENCE TO RELATED APPLICATION

This application claims the benefit under 35 USC 119(e) of U.S. provisional application No. 61/142,543, filed Jan. 5, 2009, the contents of which are herein incorporated by reference.

FIELD OF THE INVENTION

This invention relates to the field of microelectromechanical systems (MEMS), and in particular a method of making MEMS devices for biomedical applications (BIOMEMS).

BACKGROUND OF THE INVENTION

Biomems devices are used in the medical field for the analysis of fluids. For this purpose, there is a need to construct such devices containing micro-channels. Various prior art techniques for fabricating such channels are known.

Various Prior Art references related to the fabrication of micro-channels. Examples of such techniques are described in the following patents: U.S. Pat. No. 6,186,660 " " Microfluidic systems incorporating varied channel dimensions>>; U.S. Pat. No. 6,180,536 <<Suspended moving channels and channel actuators for . . . >>; U.S. Pat. No. 6,174,675 <<Electrical current for controlling fluid parameters in . . . >>; U.S. Pat. No. 6,172,353 <<System and method for measuring low power signals>>; U.S. Pat. No. 6,171,865 <<Simultaneous analyte determination and reference . . . >>; U.S. Pat. No. 6,171,850 <<Integrated devices and systems for performing . . . >>; U.S. Pat. No. 6,171,067 <<Micropump>>; U.S. Pat. No. 6,170,981 <<In situ micromachined mixer for microfluidic analytical . . . >>; U.S. Pat. No. 6,167,910 <<Multi-layer microfluidic devices>>; U.S. Pat. No. 6,159,739 <<Device and method for 3-dimensional alignment of . . . >>; U.S. Pat. No. 6,156,181 <<Controlled fluid transport microfabricated polymeric . . . >>; U.S. Pat. No. 6,154,226 <<Parallel print array>>; U.S. Pat. No. 6,153,073 <<Microfluidic devices incorporating improved channel . . . >>; U.S. Pat. No. 6,150,180 <<High throughput screening assay systems in . . . >>; U.S. Pat. No. 6,150,119 <<Optimized high-throughput analytical system>>; U.S. Pat. No. 6,149,870 <<Apparatus for in situ concentration and/or dilution of . . . >>; U.S. Pat. No. 6,149,787 <<External material accession systems and methods>>; U.S. Pat. No. 6,148,508 <<Method of making a capillary for electrokinetic . . . >>; U.S. Pat. No. 6,146,103 <<Micromachined magnetohydrodynamic actuators . . . >>; U.S. Pat. No. 6,143,248 <<Capillary microvalve>>; U.S. Pat. No. 6,143,152 <<Microfabricated capillary array electrophoresis device . . . >>; U.S. Pat. No. 6,137,501 <<Addressing circuitry for microfluidic printing apparatus>>; U.S. Pat. No. 6,136,272 <<Device for rapidly joining and splitting fluid layers>>; U.S. Pat. No. 6,136,212 <<Polymer-based micromachining for microfluidic devices>>; U.S. Pat. No. 6,132,685 <<High throughput microfluidic systems and methods>>; U.S. Pat. No. 6,131,410 <<Vacuum fusion bonding of glass plates>>; U.S. Pat. No. 6,130,098 <<Moving microdroplets>>; U.S. Pat. No. 6,129,854 <<Low temperature material bonding technique>>; U.S. Pat. No. 6,129,826 <<Methods and systems for enhanced fluid transport>>; U.S. Pat. No. 6,126,765 <<Method of producing microchannel/microcavity . . . >>; U.S. Pat. No. 6,126,140 <<Monolithic bi-directional microvalve with enclosed . . . >>; U.S. Pat. No. 6,123,798 <<Methods of fabricating polymeric structures . . . >>; U.S. Pat. No. 6,120,666 <<Microfabricated device and method for multiplexed . . . >>; U.S. Pat. No. 6,118,126 <<Method for enhancing fluorescence>>; U.S. Pat. No. 6,107,044 <<Apparatus and methods for sequencing nucleic . . . >>; U.S. Pat. No. 6,106,685 <<Electrode combinations for pumping fluids>>; U.S. Pat. No. 6,103,199 <<Capillary electroflow apparatus and method>>; U.S. Pat. No. 6,100,541 <<Microfluidic devices and systems incorporating . . . >>; U.S. Pat. No. 6,096,656 <<Formation of microchannels from low-temperature . . . >>; U.S. Pat. No. 6,091,502 <<Device and method for performing spectral . . . >>; U.S. Pat. No. 6,090,251 <<Microfabricated structures for facilitating fluid . . . >>; U.S. Pat. No. 6,086,825 <<Microfabricated structures for facilitating fluid . . . >>; U.S. Pat. No. 6,086,740 <<Multiplexed microfluidic devices and systems>>; U.S. Pat. No. 6,082,140 <<Fusion bonding and alignment fixture>>; U.S. Pat. No. 6,080,295 <<Electropipettor and compensation means for . . . >>; U.S. Pat. No. 6,078,340 <<Using silver salts and reducing reagents in . . . >>; U.S. Pat. No. 6,074,827 <<Microfluidic method for nucleic acid purification and . . . >>; U.S. Pat. No. 6,074,725 <<Fabrication of microfluidic circuits by printing techniques>>; U.S. Pat. No. 6,073,482 <<Fluid flow module>>; U.S. Pat. No. 6,071,478 <<Analytical system and method>>; U.S. Pat. No. 6,068,752 <<Microfluidic devices incorporating improved channel . . . >>; U.S. Pat. No. 6,063,589 <<Devices and methods for using centripetal . . . >>; U.S. Pat. No. 6,062,261 <<Microfluidic circuit designs for performing . . . >>; U.S. Pat. No. 6,057,149 <<Microscale devices and reactions in microscale devices>>; U.S. Pat. No. 6,056,269 <<Microminiature valve having silicon diaphragm>>; U.S. Pat. No. 6,054,277 <<Integrated microchip genetic testing system>>; U.S. Pat. No. 6,048,734 <<Thermal microvalves in a fluid flow method>>; U.S. Pat. No. 6,048,498 <<Microfluidic devices and systems>>; U.S. Pat. No. 6,046,056 <<High throughput screening assay systems in . . . >>; U.S. Pat. No. 6,043,080 <<Integrated nucleic acid diagnostic device>>; U.S. Pat. No. 6,042,710 <<Methods and compositions for performing molecular>>; U.S. Pat. No. 6,042,709 <<Microfluidic sampling system and methods>>; U.S. Pat. No. 6,012,902 <<Micropump>>; U.S. Pat. No. 6,011,252 <<Method and apparatus for detecting low light levels>>; U.S. Pat. No. 6,007,775 <<Multiple analyte diffusion based chemical sensor>>; U.S. Pat. No. 6,004,515 <<Methods and apparatus for in situ concentration . . . >>; U.S. Pat. No. 6,001,231 <<Methods and systems for monitoring and controlling . . . >>; U.S. Pat. No. 5,992,820 <<Flow control in microfluidics devices by controlled . . . >>; U.S. Pat. No. 5,989,402 <<Controller/detector interfaces for microfluidic systems>>; U.S. Pat. No. 5,980,719 <<Electrohydrodynamic receptor>>; U.S. Pat. No. 5,972,710 <<Microfabricated diffusion-based chemical sensor>>; U.S. Pat. No. 5,972,187 <<Electropipettor and compensation means for . . . >>; U.S. Pat. No. 5,965,410 <<Electrical current for controlling fluid parameters in . . . >>; U.S. Pat. No. 5,965,001 <<Variable control of electroosmotic and/or . . . >>; U.S. Pat. No. 5,964,995 <<Methods and systems for enhanced fluid transport>>; U.S. Pat. No. 5,958,694 <<Apparatus and methods for sequencing nucleic acids . . . >>; U.S. Pat. No. 5,958,203 <<Electropipettor and compensation means for . . . >>; U.S. Pat. No. 5,957,579 <<Microfluidic systems incorporating varied channel . . . >>; U.S. Pat. No. 5,955,028 <<Analytical system and method>>; U.S. Pat. No. 5,948,684 <<Simultaneous analyte determination and reference . . . >>; U.S. Pat. No. 5,948,227 <<Methods and systems for performing electrophoretic . . . >>; U.S. Pat. No. 5,942,443 <<High throughput screening assay systems in . . . >>; U.S. Pat. No. 5,932,315 <<Microfluidic structure assembly with mating . . . >>; U.S. Pat. No. 5,932,100 <<Microfabricated differential extraction device and . . . >>; U.S. Pat. No. 5,922,604 <<Thin reaction chambers for containing and handling . . . >>; U.S. Pat. No. 5,922,210 <<Tangential flow planar microfabricated fluid filter and . . . >>; U.S. Pat. No. 5,885,470 <<Controlled fluid transport in microfabricated polymeric . . . >>; U.S. Pat. No. 5,882,465 <<Method of manufacturing microfluidic devices>>; U.S. Pat. No. 5,880,071 <<Electropipettor and compensation means for . . . >>; U.S. Pat. No. 5,876,675 <<Microfluidic devices and systems>>; U.S. Pat. No. 5,869,004 <<Methods and apparatus for in situ concentration . . . >>; U.S. Pat. No. 5,863,502 <<Parallel reaction cassette and associated devices>>; U.S. Pat. No. 5,856,174 <<Integrated nucleic acid diagnostic device>>; U.S. Pat. No. 5,855,801 <<IC-processed microneedles>>; U.S. Pat. No. 5,852,495 <<Fourier detection of species migrating in a . . . >>; U.S. Pat. No. 5,849,208 <<Making apparatus for conducting biochemical analyses>>; U.S. Pat. No. 5,842,787 <<Microfluidic systems incorporating varied channel . . . >>; U.S. Pat. No. 5,800,690 <<Variable control of electroosmotic and/or . . . >>; U.S. Pat. No. 5,779,868 <<Electropipettor and compensation means for . . . >>; U.S. Pat. No. 5,755,942 <<Partitioned microelectronic device array>>; U.S. Pat. No. 5,716,852 <<Microfabricated diffusion-based chemical sensor>>; U.S. Pat. No. 5,705,018 <<Micromachined peristaltic pump>>; U.S. Pat. No. 5,699,157 <<Fourier detection of species migrating in a . . . >>; U.S. Pat. No. 5,591,139<<IC-processed microneedles>>; and U.S. Pat. No. 5,376,252 <<Microfluidic structure and process for its manufacture>>.

The following published paper shows the Prior Art concerning a polydimethylsiloxane (PDMS) biochip capable of capacitance detection of biological entities (mouse cells): L. L. Sohn, O. A. Saleh, G. R. Facer, A. J. Beavis, R. S. Allan, and D. A. Notterman, 'Capacitance cytometry: Measuring biological cells one by one', Proceedings of the National Academy of Sciences (USA), Vol. 97, No. 20, Sep. 26, 2000, pp. 10687-10690

The above prior art USA patents show that passive microchannel biochip devices are fabricated using fusion bonding of a combination of various substrates, such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF). These Prior Art USA patents show that mechanical stamping or thermal forming techniques are used to define a network of micro-channels in a first substrate prior its fusion bonding to another such substrate, as to form microchannels between the two bonded substrates. The result is a simple passive microchannel biochip device which can be patterned with conductive layers as to connect an external processor used to provoke fluid movement by electrophoresis or electroosmosis, analysis and data generation. An example of such passive microchannel biochip devices obtained from the fusion of such polymeric substrates is disclosed in U.S. Pat. No. 6,167,910 <<Multi-layer microfluidic devices>>.

These Prior Art USA patents also indicate that passive micro-channel biochip devices can be fabricated from the combination of various micro-machined silica or quartz substrates. Again, assembly and fusion bonding is required. The result is again a simple passive biochip device which can be patterned with conductive layers as to connect an external processor used to provoke fluid movement by electrophoresis or electroosmosis, analysis and data generation. An example of such passive micro-channel biochip devices obtained from the fusion of such silica substrates is disclosed in U.S. Pat. No. 6,131,410 <<Vacuum fusion bonding of glass plates>>.

These Prior Art USA patents also indicate that passive micro-channel biochip devices can be fabricated from a passive micro-machined silicon substrate. In that case, the silicon substrate is used as a passive structural material. Again, assembly and fusion bonding of at least two sub-assemblies is required. The result is again a simple passive biochip to connect to an external processor used to provoke fluid movement, analysis and data generation. An example of such passive micro-channel biochip devices obtained from a passive micro-machined silicon substrate is disclosed in U.S. Pat. No. 5,705,018 <<Micromachined peristaltic pump>>.

These Prior Art USA patents also indicate that active micro-reservoir biochip devices can be fabricated from machining directly into an active silicon substrate. In that case, the control electronics integrated in the silicon substrate is used as an active on-chip fluid processor and communication device. The result is a sophisticated biochip device which can perform, into pre-defined reservoirs, various fluidics, analysis and (remote) data communication functions without the need of an external fluid processor in charge of fluid movement, analysis and data generation. An example of such active micro-reservoir biochip devices obtained from an active micro-machined silicon substrate is disclosed in U.S. Pat. No. 6,117,643 <<Bioluminescent bioreporter integrated circuit These Prior Art references also indicate that passive polydimethylsiloxane (PDMS) biochips have been developed for the detection of biological entities using gold coated capacitor electrodes. An example of such passive polydimethylsiloxane (PDMS) biochips with gold electrodes is disclosed in the paper by L. L. Sohn, O. A. Saleh, G. R. Facer, A. J. Beavis, R. S. Allan, and D. A. Notterman, 'Capacitance cytometry: Measuring biological cells one by one', Proceedings of the National Academy of Sciences (USA), Vol. 97, No. 20, Sep. 26, 2000, pp. 10687-10690).

These Prior Art references also indicate that wax has been used to fabricate such microchannels. This process requires the top covers of the microchannels to be first bonded to a carrier wafer using a low temperature wax. Then, a photosensitive benzocyclobutene, BCB, is spun-on, exposed and developed as to define the sidewalls of the microchannels. Then the photodefined BCB of the carrier wafer is properly aligned and bonded to a receiving wafer integrating the bottoms of the microchannels. Then the wax of the carrier wafer is heated above its melting point as to detach the BCB bonded sidewalls and covers of the carrier wafer onto the bottoms of the receiving wafer, thus creating microchannels. An example of such an approach in shown A. Jourdain, X. Rottenberg, G. Carchon and H. A. C. Tilmanstitled, 'Optimization of 0-Level Packaging for RF-MEMS Devices', Transducers 2003, The 12th International Conference on Solid State Sensors, Actuators and Microsystems, Boston, Jun. 8-12, 2003, pp. 1915-1918

These Prior Art references also indicate that parylene could be used to fabricate such microchannels. A carrier wafer could be first coated with 1.3 um of AZ1813 sacrificial photoresist over which a 0.38 um thick layer of parylene could be deposited and patterned to expose the underlying layer of parylene. Following local etch of the exposed parylene the underlying sacrificial photoresist could be dissolved in acetone to leave an array of free-standing parylene covers on the carrier wafer. The patterned receiving wafer integrating the sidewalls and bottoms of the microchannels could be coated with another layer of 0.38 um thick layer of parylene, could be aligned and could be pressed against the free standing pattern of parylene on the carrier wafer while heating at 230° C. under a vacuum of 1.5*10$^{-4}$ Torr. The two parylene layers could polymerize together and would result in bond strength of 3.6 MPa. An example of such an approach in shown in the paper by H. S. Kim and K. Najafi, 'Wafer Bonding Using Parylene and Wafer-Level Transfer of Free-Standing Parylene Membranes', Transducers 2003, The 12th International Conference on Solid State Sensors, Actuators and Microsystems, Boston, Jun. 8-12, 2003, pp. 790-793

U.S. patent application No. 60/894,930, Mar. 15, 2007 describes a BioMEMS fabrication process that uses a temporary adhesion layer made of silicon nitride exposed to anhydrous hydrofluoric acid as the temporary adhesion layer.

SUMMARY OF THE INVENTION

Accordingly the present invention provides a method of making a MEMS device comprising forming a self-aligned monolayer (SAM) on a carrier wafer; forming a first polymer layer on said self-assembled monolayer; patterning said first polymer layer to form a microchannel cover; bonding said microchannel cover to a patterned second polymer layer on a device wafer to form microchannels; and releasing said carrier wafer from the first polymer layer.

The present invention thus provides a novel, simple, inexpensive, high precision, gold-free, sodium-free and potassium-free process allowing the formation, at a temperature of less than 250° C., of hundreds if not thousands of microfluidics microchannels on a CMOS wafer integrating hundreds if not thousands of digital and/or analog CMOS control logic and/or high voltage CMOS drivers capable of performing sensing and/or microfluidics actuation functions. This novel BioMEMS fabrication process uses a hydrophobic self-aligned monolayer, SAM, (also known as a self-assembled monolayer) as a temporary adhesion layer between a carrier wafer and the hundreds if not thousands of photolithographically defined microfluidic microchannels to be transferred onto the Device Wafer integrating hundreds if not thousands of digital and/or analog CMOS control logic and/or high voltage CMOS drivers capable of performing sensing and/or microfluidics actuation functions.

The SAM monolayer provides a strong bond during manufacture of the MEMS device to permit the carrier and device wafers to be bonded together, while providing an easy release of the carrier wafer from the device wafer after the two components have been bonded together.

While the carrier wafer I one embodiment is a silicon carrier wafer, it could also be a glass carrier wafer, a compound semiconductor carrier wafer, a ceramic carrier wafer, or a metal carrier wafer.

The SAM coating may be (Tridecafluoro-1,1,2,2-tetrahydrooctyl)trichlorosilane, $C_8H_4Cl_3F_{13}Si$ (FOTS), dimethyldichlorosilane (DDMS); coating is tridecafluoro-1; or heptadecafluoro-1,1,2,2-tetrahydrodecyltrichlorosilane (FDTS).

The first polymer layer may be a photopolymer, preferably a negative tone photopolymer, and more preferably an epoxy-like negative tone photopolymer such as one of the NANO SU-8 series from MicroChem Corporation, namely SU-8 2005; SU-8 2010; SU-8 2025; SU-8 2050; SU-8 2100.

Alternatively, the epoxy-like negative tone photopolymer may be one of the GM or GLM SU-8 series from Gerstel Ltd, such as GM1040; GM1060; GM1070; GLM2060; GLM3060.

The epoxy-like negative tone photopolymer can also be one of the XP KMPR-1000 SU8 series from Kayaku Microchem Corporation, such as XP KMPR-1005; XP KMPR-1010; XP KMPR-1025; XP KMPR-1050; XP KMPR-1100.

The device wafer may contain a combination of two sublayers of photopolymers, where the first and second photopolymers are also a negative tone photopolymer, and in particular an epoxy-like negative tone photopolymer of the type listed above.

The photopolymer on the carrier wafer is preferably about 20 um thick, although the thickness may range between 5 um and 500 um.

The first and second photopolymer sublayers on the device wafer are preferably about 10 um thick, although the thickness may range between 5 um and 500 um.

The photopolymer of course should be strong enough to provide a cover of microchannels.

The combination of two layers of photopolymer sublayers on the device wafer should be strong enough to become the sidewalls and bottoms of microchannels.

The photopolymer is typically exposed using a UV source, preferably a broadband UV source (g-line, h-line and l-line), where broadband UV source is highly collimated to achieve high aspect ratio features.

The device wafer may contain more than two sublayers of photopolymers to produce more than one level of microchannels.

BRIEF DESCRIPTION OF THE DRAWINGS

The invention will now be described in more detail, by way of example only, with reference to the accompanying drawings, in which:

FIG. 1A is glazing angle αicture of the contact angle of water droplets on a virgin silicon wafer not covered with a SAM coating;

FIG. 1B is glazing angle picture of the contact angle of water droplets on a virgin silicon wafer covered with a SAM coating;

FIG. 2 shows the chemical structure of (Tridecafluoro-1,1,2,2-tetrahydrooctyl)trichlorosilane, $C_8H_4Cl_3F_{13}Si$;

DETAILED DESCRIPTION OF THE PREFERRED EMBODIMENTS

The glazing angle pictures shown in FIGS. 1A and 1B were taken by a Kruss G10/DSA10 Drop Shape Analysis System and the contact angle of water droplets onto a virgin silicon wafer not covered by the SAM coating (FIG. 1A) and of the contact angle of water droplets onto a virgin silicon wafer covered by the SAM coating (FIG. 1b). The increased contact angle of about 108° clearly shows the hydrophobic nature of the SAM coating.

Figure 3:
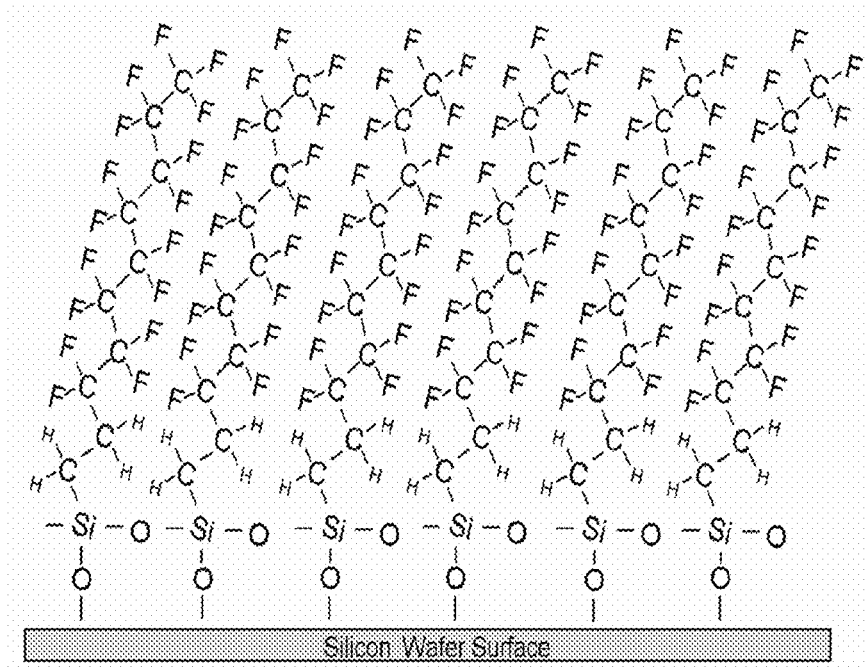
FIG. 3 shows The self-alignment of (Tridecafluoro-1,1,2,2-tetrahydrooctyl)trichlorosilane, $C_8H_4Cl_3F_{13}Si$, onto a silicon wafer resulting from the 'SAM treatment' before 'Post-SAM treatment'.
Figure 4:
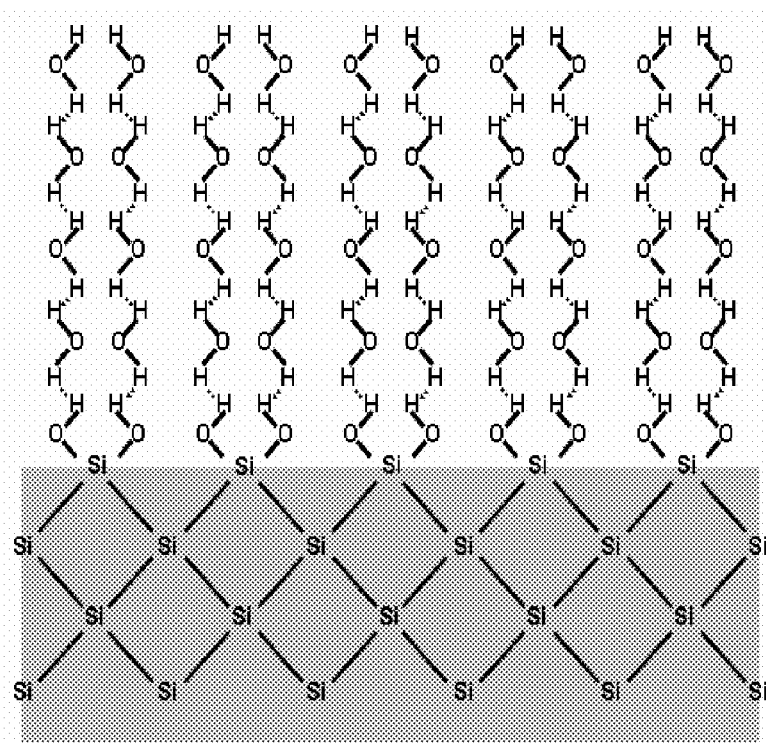
FIG. 4 shows the surface condition of a silicon wafer after being exposed to standard atmospheric conditions. Layers of water molecules are adsorbed onto the silicon surface due to hydrogen van der Waals bonds.
Figure 5:
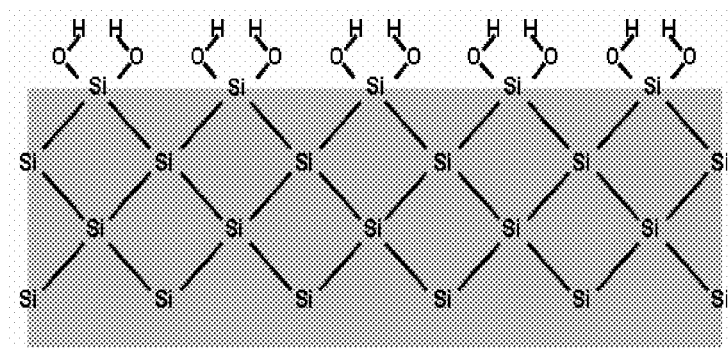
FIG. 5 shows the surface condition of a silicon wafer after being vacuum dehydrated at about 150° C. for about 60 minutes followed by an air exposure of less then about two hours prior to the SAM coating.

FIG. 2 shows the chemical structure of (Tridecafluoro-1,1,2,2-tetrahydrooctyl)trichlorosilane, $C_8H_4Cl_3F_{13}Si$ and its surface organization when self-aligned onto a silicon wafer. FIG. 3 shows the self-alignment of (Tridecafluoro-1,1,2,2-tetrahydrooctyl)trichlorosilane, $C_8H_4Cl_3F_{13}Si$, onto a silicon wafer resulting from the SAM coating. FIG. 4 shows the surface condition of a silicon wafer after being exposed to standard atmospheric conditions. Layers of water molecules are adsorbed onto the silicon surface due to hydrogen van der Waals bonds. These layers need to be removed by a mild vacuum heat treatment prior to the application of the SAM coating. A typical processing condition is a vacuum dehydratation at about 150° C. for about 60 minutes followed by an air exposure of less than about two hours prior to the SAM coating.

FIG. 4 shows the surface condition of a silicon wafer after being vacuum dehydrated at about 150° C. for about 60 minutes followed by an air exposure of less than about two hours prior to the SAM coating.

Following the loading of the dehydrated and air exposed silicon wafers into the vacuum chamber used for the 'SAM treatment', a series of vacuum pump-downs and dry nitrogen back-fills allow the elimination of the residual oxygen and water vapour present in the atmospheric ambient around the wafers during the loading process. Following one of the pump-down, a bleeding valve is opened as to allow vapours of (Tridecafluoro-1,1,2,2-tetrahydrooctyl)trichlorosilane, $C_8H_4Cl_3F_{13}Si$, to enter the vacuum chamber at a temperature of about 40° C. Pump-down is again performed as to eliminate HCl by-products resulting from the 'SAM treatment'. The bleeding valve is again opened as to perform another cycle, and so on. The number of cycles is load dependant and requires to be increased depending upon the surface area of silicon to be treated. A filan pump-down followed by a nitrogen purge is used to un-load the 'SAM treated' silicon wafers.

Figure 6:
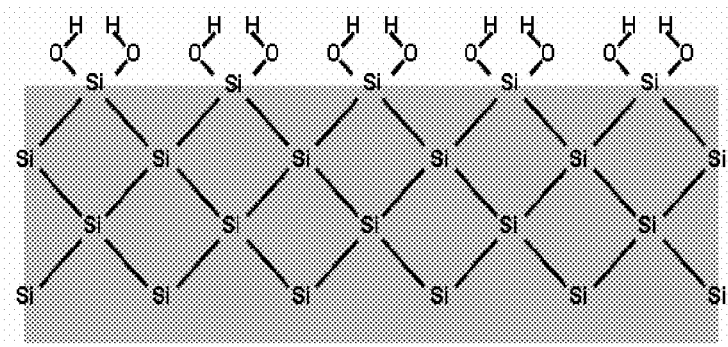
FIG. 6 shows the chemical reactions involved in the self-alignment of (Tridecafluoro-1,1,2,2-tetrahydrooctyl)trichlorosilane, $C_8H_4Cl_3F_{13}Si$, onto dehydrated and air exposed silicon wafers.

FIG. 6 shows the chemical reactions involved in the self-alignment of (Tridecafluoro-1,1,2,2-tetrahydrooctyl)trichlorosilane, $C_8H_4Cl_3F_{13}Si$, onto dehydrated and air exposed silicon wafers. Hydrogen chloride is produced from the chemical reaction of the chlorine atoms residing at the tip of the $C_8H_4Cl_3F_{13}Si$ molecules and the hydrogen atoms present at the surface of the dehydrated and air exposed silicon wafers. The resulting surface is the one shown FIG. 3.

Figure 7:
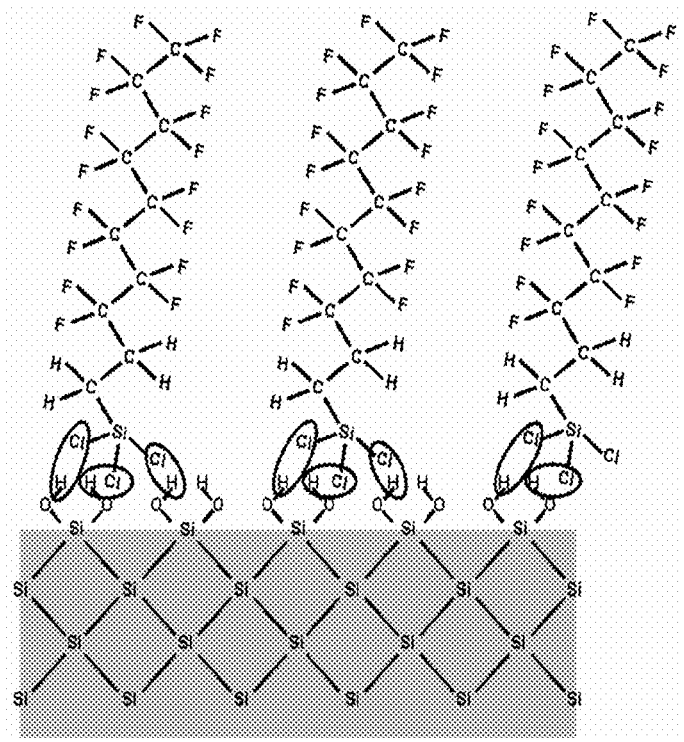
FIG. 7 shows the cross-linking chemical reactions involving the side hydrogen atoms present at the tip of the $C_8H_4Cl_3F_{13}Si$ molecules.

Following the 'SAM treatment', wafers are loaded in the 'Post-SAM treatment' system shown to perform the cross-linking chemical reaction that result in a dense SAM coating with good adhesion to the silicon substrate. This process involves the elimination of molecular hydrogen gas and results in a dense hydrophobic SAM coating. FIG. 7 shows the cross-linking chemical reaction involving the side hydrogen atoms also present at the tip of the $C_8H_4Cl_3F_{13}Si$ molecules and shows how each $C_8H_4Cl_3F_{13}Si$ molecule is attached to each other with high energy double covalent 'C=C' bonds. These extremely strong 'C=C' covalent bonds coupled with the very strong 'C—Si' covalent bonds to the silicon substrate result in the observed excellent adhesion.

Figure 8A:
FIGS. 8A to 8E show steps in the manufacture of a carrier wafer.
Figure 8B:
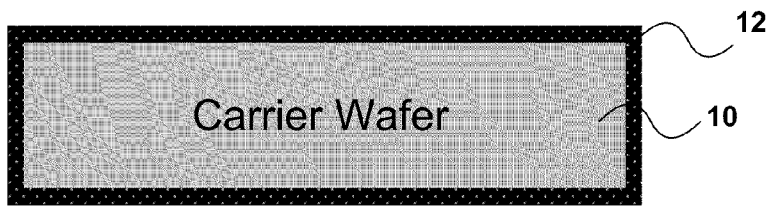

In order to produce a MEMS device in accordance with one embodiment of the invention, a SAM coating 12 is first deposited onto the carrier wafer 10 as shown in FIGS. 8A and 8B.

Figure 8C:
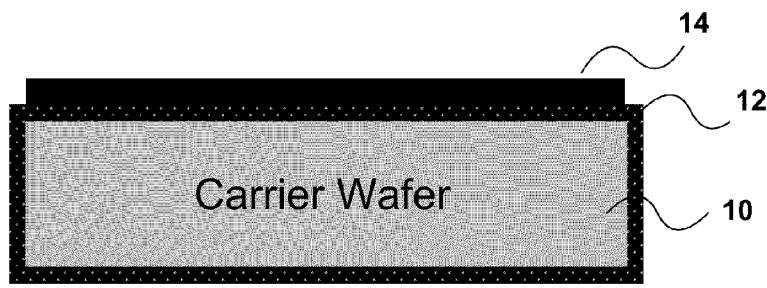

Next a 20 um thick layer 14 of photopolymer is applied by spinning directly onto the SAM coating (FIG. 8C). The thickness of this first layer is adjusted in such a way that it will be strong enough to be used as cover of the microchannel. Following proper dispensing, spinning and solidification by partial solvents evaporation, the dried photopolymer is subjected to a pre-exposure bake not exceeding 95° C. to drive-off more of its residual solvents in preparation for the exposure to ultra-violet light through a suitably designed mask.

Figure 8D:
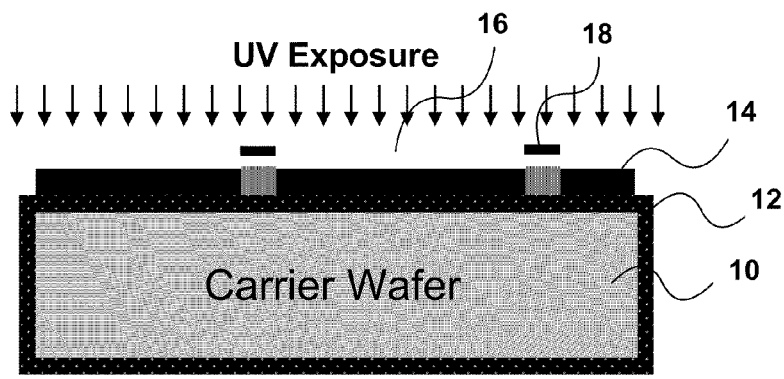

FIG. 8D shows that this 20 um thick layer of photopolymer is exposed to ultraviolet light through the openings 16 of the mask 18 defining the shape of the cover of the microchannel. Being of negative tone, the photopolymer will reticulate in the regions exposed to the ultraviolet light and will locally become resistant to the chemical attack of the developer to be used later in the process. Following ultraviolet light exposure for an optimized dose, this first layer of a thick negative tone photopolymer is subjected to a post-exposure bake again not exceeding 95° C. to drive-off more of the residual solvents and the chemical by-products formed by the ultra-violet light exposure.

Figure 8E:
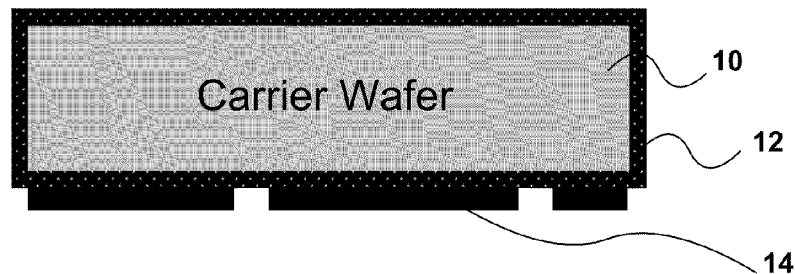

FIG. 8E shows that this 20 um thick layer of photopolymer is developed, thus defining the cover of the microchannel. The regions of the photopolymer that have being exposed to the ultraviolet light passing through the openings of the mask remain intact because resistant to the chemical attack of the developer. Following suitable development of the photopolymer, the resulting photopolymer patterns are subjected to a post-develop bake again not exceeding 95° C. to drive-off more of the residual solvents and the chemical by-products formed by the ultra-violet light exposure and by the developer. At this point, the developed and baked photopolymer patterns of the carrier wafer are ready to be flipped over and aligned to the device wafer.

Figure 9A:
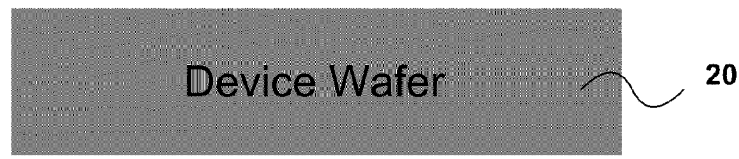
FIGS. 9A to 9E show steps in the manufacture of a device wafer.

FIG. 9A shows the silicon wafer 20 used as device wafer substrate.

Figure 9B:
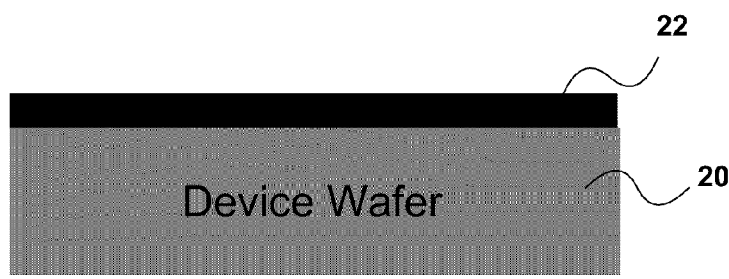

A 10 um thick layer 22 of photopolymer is applied by spinning as shown in FIG. 9B. This layer 22 is to become the bottom of the microchannel. Following proper dispensing, spinning and solidification by partial solvents evaporation, the dried photopolymer is subjected to a high temperature bake to drive-off its residual solvents and to allow the photopolymer to be stabilized i.e. to become chemically stable when an upper layer of photopolymer will be spun-on and exposed in a further step.

Figure 9C:
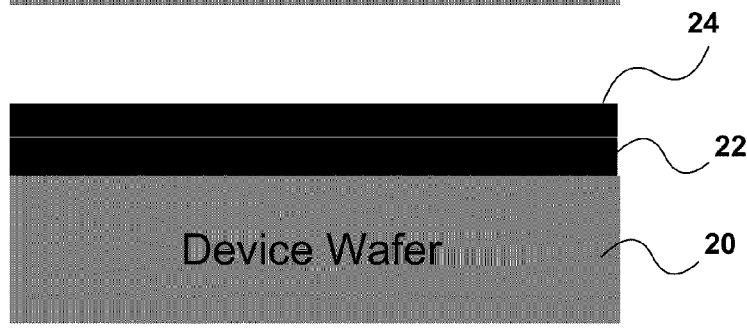
Figure 9D:
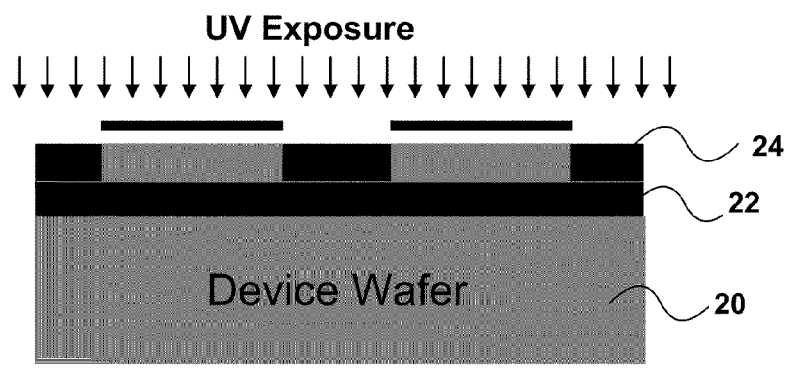

A second layer 24 of a 10 um thick negative tone photopolymer is then applied by spinning onto the exposed first layer of a thick negative tone photopolymer as shown in FIG. 9C. This second layer 24 is to become the sidewall of the microchannel. The thickness of this second layer is adjusted in such a way that it will form tall enough microchannels confined between the already stabilized bottom layer of the device wafer and the top layer yet to be transferred from the carrier wafer. Following proper dispensing, spinning and solidification by partial solvents evaporation, the dried photopolymer is subjected to a pre-exposure bake not exceeding 95° C. to drive-off more of its residual solvents in preparation for the exposure to ultra-violet light through a suitably designed mask;

This second layer 24 of 10 um thick negative tone photopolymer is exposed to ultraviolet light through the openings of the mask as shown in FIG. 9D. Being of negative tone, the photopolymer will reticulate in the regions exposed to the ultraviolet light and will locally become resistant to the chemical attack of the developer to be used later in the process. Following ultraviolet light exposure for an optimized dose, this second layer of a thick negative tone photopolymer is subjected to a post-exposure bake again not exceeding 95°

C. to drive-off more solvents and chemical by-products formed by the ultra-violet light exposure.

Figure 9E:
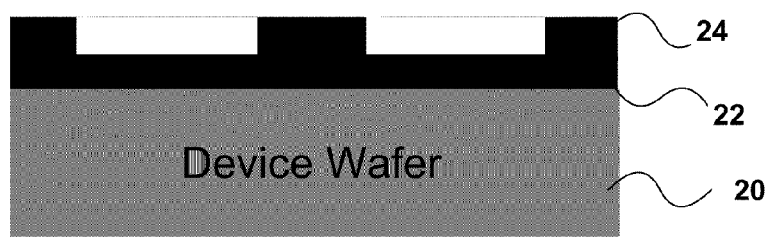
Figure 10A:
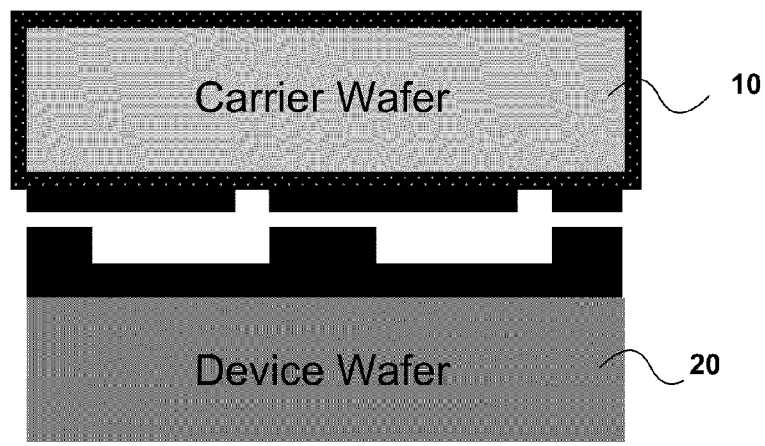
FIGS. 10A to 10C show the final assembly steps of the carrier and device wafers.

FIG. 9E shows that this second layer 22 of a suitably exposed 10 um thick negative tone photopolymer is developed into a proper developer, thus defining the shape of the microchannels. The regions of the photopolymer that have being exposed to the ultraviolet light passing through the openings of the mask remain intact because resistant to the chemical attack of the developer. Following suitable development of the photopolymer, the resulting photopolymer patterns are subjected to a post-develop bake again not exceeding 95° C. to drive-off more of the residual solvents and the chemical by-products formed by the ultra-violet light exposure and by the develop. At this point, the developed and baked photopolymer patterns of the Device Wafer are ready to be aligned and to receive the transferred top photopolymer layer of the carrier wafer FIG. 10A shows that the carrier wafer supporting the developed and baked photopolymer patterns defining the cover of the microchannel is flipped-over and properly aligned to the Device Wafer integrating the sidewall and bottom of the microchannel. The precise alignment is such that the aligned wafers, not yet in physical contact, are kept in position using a special fixture in preparation for loading of the pair of wafers into a wafer bonding equipment.

Figure 10B:
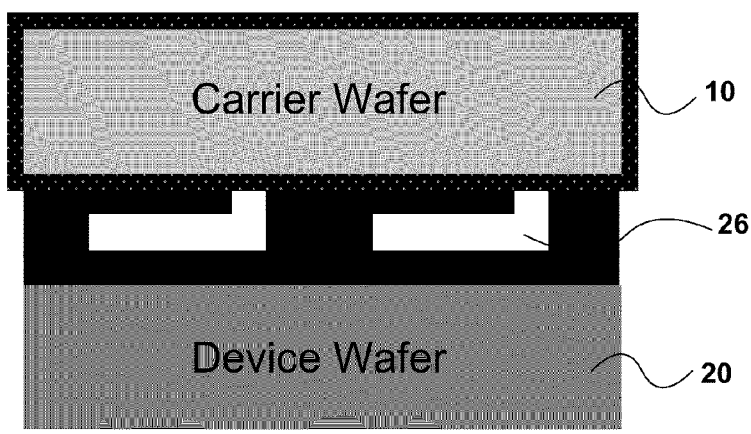

FIG. 10B shows the pair of properly aligned wafers ready to be loaded into wafer bonding equipment that allows these to become in physical contact by pressing one against the other without losing alignment accuracy. The pair of wafers is then heated, under vacuum, to a temperature of about 120-150° C. while maintaining the two wafers under intimate contact, as to provoke the bonding of the photopolymer of the carrier wafer to the exposed photopolymer of the device wafer. Following proper baking at a temperature of about 120-150° C. while maintaining the two wafers under intimate contact, the pair of wafers is unloaded from the wafer bonding equipment and the two wafers are separated.

Figure 10C:
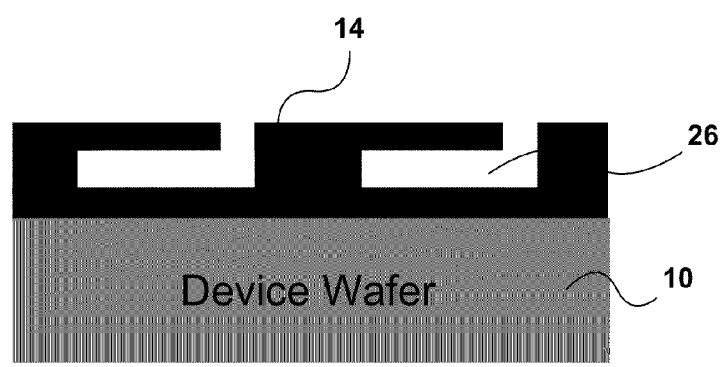

FIG. 10C shows that the MEMS device after separation of the two wafers. The separation is possible due to the hydrophobic nature of the SAM coating. This wafer separation can be performed using an EVG-850 DB wafer debonder.

The device now incorporating the microchannels 26 is heated under vacuum at more than 200° C. as to chemically stabilize the photopolymer and as to achieve a solid permanent microchannel.

Embodiments of the invention thus provide a novel, simple, inexpensive, high precision, gold-free, sodium-free and potassium-free process allowing the formation, at a temperature of less than 250° C., of hundreds if not thousands of microfluidics microchannels on a CMOS wafer integrating hundreds if not thousands of digital and/or analog CMOS control logic and/or high voltage CMOS drivers capable of performing sensing and/or microfluidics actuation functions. This new BioMEMS fabrication process uses an hydrophobic self-aligned monolayer, SAM, as temporary adhesion layer between a Carrier Wafer and the hundreds if not thousands of photolithographically defined microfluidics microchannels to be transferred onto the Device Wafer integrating hundreds if not thousands of digital and/or analog CMOS control logic and/or high voltage CMOS drivers capable of performing sensing and/or microfluidics actuation functions.

The silicon wafer used as the carrier wafer is preferably a SEMI standard 150 mm diameter silicon wafer but could also be a 100 mm diameter, a 200 mm diameter or a 300 mm diameter silicon wafer.

The preferred 20 um thick layer 14 of a negative tone photopolymer is applied by spinning onto the SAM coating. Such a preferred photopolymer is SU-8, a negative tone epoxy-like near-UV photoresist developed by IBM and disclosed in U.S. Pat. No. 4,882,245 entitled: 'Photoresist Composition and Printed Circuit Boards and Packages Made Therewith'. This high performance photopolymer is available from three companies: MicroChem Corporation, a company previously named Microlithography Chemical Corporation, of Newton, Mass., USA. The photopolymer is sold under the name NANO SU-8 at different viscosities: SU-8 2005; SU-8 2010; SU-8 2025; SU-8 2050; SU-8 2100; Gerstel Ltd, a company previously named SOTEC Microsystems, of Pully, Switzerland. The photopolymer is sold under the name GM or GLM at different viscosities: GM1040; GM1060; GM1070, GLM2060, GLM3060; and Kayaku Microchem Corporation (KMCC), of Chiyoda-Ku, Tokyo, Japan. The photopolymer is sold under the name XP KMPR-1000 SU8 at different viscosities: XP KMPR-1005; XP KMPR-1010; XP KMPR-1025; XP KMPR-1050; XP KMPR-1100.

This high performance photopolymer may be spin coated using one of the two coat stations of an EV Group Hercules processor. About 3 ml of Microchem SU-8 2025 photopolymer solution is dispensed above the 150 mm wafer before spinning at about 1600 RPM as to dry the spin-on photopolymer by partial solvents evaporation and as to achieve a film thickness of preferably 20 um to be strong enough to become the protection capsule. The dried photopolymer is subjected to a pre-exposure bake not exceeding 95° C. and for about 8 to 10 minutes as to drive-off more of its residual solvents. This MicroChem SU-8 2025 negative tone photopolymer can alternately be replaced by the Gerstel GM 1060 or GLM2060 negative tone photopolymer or by the Kayaku Microchem XP KMPR 1025 negative tone photopolymer to achieve the same preferred thickness of 20 um. The viscosity of the photopolymer solution could be lower than the one of the Microchem SU-8 2025 photopolymer solution as to reduce the thickness of this first layer of negative tone photopolymer from 40 um down to about 5 um. In that case, the Microchem SU-8 2005 or SU-8 2010 negative tone photopolymer solution could be used, the Gerstel GM 1040 negative tone photopolymer solution could be used, or the Kayaku Microchem XP KMPR 1005 or XP KMPR-1010 negative tone photopolymer solution could be used. Alternately, the viscosity of the photopolymer solution could be higher than the one of the Microchem SU-8 2025 photopolymer solution as to increase the thickness of this first layer of negative tone photopolymer from 20 um up to about 500 um. In that case, the Microchem SU-8 2050 or SU-8 2100 negative tone photopolymer solution could be used, the Gerstel GM 1070 negative tone photopolymer solution could be used, or the Kayaku Microchem XP KMPR 1050 or XP KMPR-1100 negative tone photopolymer solution could be used. To thicker negative tone photopolymer layers should be associated a longer than 90 seconds pre-exposure bake but still not exceeding 95° C. and for about as to drive-off the residual solvents.

FIG. 8D shows that this preferably 20 um thick layer of negative tone photopolymer is exposed using the highly collimated broadband UV source (g-line, h-line and l-line) of the EV Group Hercules processor through the openings of the mask defining the shape of the protection capsule. Being of negative tone, the photopolymer will reticulate in the regions exposed to the ultraviolet light and will locally become resistant to the chemical attack of the developer to be used later in the process. Following ultraviolet light exposure for an optimized dose of about 180 mJ/cm$^2$, this first layer of a thick negative tone photopolymer is subjected to a 5 minutes duration post-exposure bake again not exceeding 95° C. as to drive-off more of the residual solvents and the chemical by-products formed by the ultra-violet light exposure. At this point, the exposed photopolymer is not yet developed. Again, if this MicroChem SU-8 2025, Gerstel GM 1060 or GLM2060 or Kayaku Microchem XP KMPR 1025 negative tone photopolymer is replaced by a lower viscosity solution such as the Microchem SU-8 2005 or SU-8 2010, the Gerstel GM 1040 or the Kayaku Microchem XP KMPR 1005 or XP KMPR-1010 negative tone photopolymer solution, then the optimized dose would be lower than about 310 mJ/cm$^2$, as to prevent over-exposure of this first layer of a negative tone photopolymer. Alternatively, if this MicroChem SU-8 2025, Gerstel GM 1060 or GM 2060 or Kayaku Microchem XP KMPR 1025 negative tone photopolymer is replaced by a higher viscosity solution such as the Microchem SU-8 2050 or SU-8 2100, the Gerstel GM 1070 or the Kayaku Microchem XP KMPR 1050 or XP KMPR-1100 negative tone photopolymer solution, then the optimized dose would be higher than about 310 mJ/cm$^2$, as to prevent under-exposure of this first layer of a negative tone photopolymer. To thicker negative tone photopolymer layers should also be associated a longer than 90 seconds post-exposure bake but still not exceeding 95° C.

FIG. 8E shows that this preferably 20 um thick layer of MicroChem SU-8 2025 negative tone photopolymer is developed using one of the two develop stations of the EV Group Hercules processor to define an array of covers to be transferred onto the array of microchannels of another substrate. The regions of the photopolymer that have being exposed to the ultraviolet light passing through the openings of the mask remain intact because resistant to the chemical attack of the developer. This layer of negative tone photopolymers is capable of achieving complex structures and mechanical features having a height:width aspect ratio as high as 10:1.

FIG. 9A shows the silicon wafer used as Device Wafer substrate. This silicon wafer is preferably a SEMI standard 150 mm diameter silicon wafer but could also be a 100 mm diameter, a 200 mm diameter or a 300 mm diameter silicon wafer;

FIG. 9B shows that a first layer of a preferably 10 um thick layer negative tone photopolymer is applied by spinning. This first layer is to become an array of bottoms of the array of microchannels. This negative tone photopolymer is spin coated using one of the two coat stations of the EV Group Hercules processor. Again, about 3 ml of Microchem SU-8 2005 is dispensed above the 150 mm wafer before spinning at about 1600 RPM as to dry the spin-on photopolymer by partial solvents evaporation and as to achieve a film thickness of preferably 10 um. The dried photopolymer is subjected to a pre-exposure bake not exceeding 95° C. and for about 5 minutes as to drive-off more of its residual solvents. This MicroChem SU-8 2005 negative tone photopolymer can alternately be replaced by the MicroChem SU-8 2010, the Gerstel GM 1040 or the Kayaku Microchem XP KMPR 1005 or XP KMPR 1010 negative tone photopolymer to achieve the same preferred thickness of 10 um. The viscosity of the photopolymer solution could be higher than the one of the MicroChem SU-8 2005 photopolymer solution as to increase its thickness above 10 um. In that case, the Microchem SU-8 2025 or SU-8 2050 or SU-8 2100, the Gerstel GM 1060, GM 1070 or GM 2060 or the Kayaku Microchem XP KMPR 1025, XP KMPR 1050 or XP KMPR-1100 negative tone photopolymer solution could be used. Again, to thicker negative tone photopolymer layers should be associated a longer than 90 seconds pre-exposure bake at about 95° C. as to drive-off more of its residual solvents. A vacuum bake at a temperature of about 180° C. is performed for about 2 hours to stabilize this first 10 um thick layer and prevent its photochemical activity when exposed to ultra-violet light.

FIG. 9C shows that a second layer of a preferably 10 um thick negative tone photopolymer is applied by spinning onto the thermally stabilized 10 um thick negative tone photopolymer. Again, this high performance photopolymer is spin coated using one of the two coat stations of the EV Group Hercules processor. Again, about 3 ml of Microchem SU-8 2005 is dispensed above the 150 mm wafer before spinning at about 1600 RPM as to dry the spin-on photopolymer by partial solvents evaporation and as to achieve a 10 um thick film. The dried photopolymer is subjected to a pre-exposure bake not exceeding 95° C. and for about 5 minutes as to drive-off more of its residual solvents. This MicroChem SU-8 2005 negative tone photopolymer can alternately be replaced by the MicroChem SU-8 2010, the Gerstel GM 1040 or the Kayaku Microchem XP KMPR 1005 or XP KMPR 1010 negative tone photopolymer to achieve the same preferred thickness of 10 um. The viscosity of the photopolymer solution could be higher than the one of the MicroChem SU-8 2005 photopolymer solution as to increase its thickness above 10 um. In that case, the Microchem SU-8 2025 or SU-8 2050 or SU-8 2100, the Gerstel GM 1060, GM 1070 or GM 2060 or the Kayaku Microchem XP KMPR 1025, XP KMPR 1050 or XP KMPR-1100 negative tone photopolymer solution could be used. Again, to thicker negative tone photopolymer layers should be associated a longer than 90 seconds pre-exposure bake but still not exceeding 95° C. and for about as to drive-off more of its residual solvents in preparation for the exposure to ultra-violet light through a properly designed mask.

FIG. 9D shows that this second layer of a preferably 10 um thick MicroChem SU-8 2005 negative tone photopolymer is exposed using the highly collimated broadband UV source (g-line, h-line and l-line) of the EV Group Hercules processor through the openings of the mask defining the array of sidewalls of the array of microchannels. Being of negative tone, the photopolymer will reticulate in the regions exposed to the ultraviolet light and will locally become resistant to the chemical attack of the developer to be used later in the process. Following ultraviolet light exposure for an optimized dose of about 180 mJ/cm$^2$, this first layer of a thick negative tone photopolymer is subjected to a 3 minutes duration post-exposure bake again not exceeding 95° C. as to drive-off more of the residual solvents and the chemical by-products formed by the ultra-violet light exposure. Again, if this MicroChem SU-8 2005 or SU-8 2010, this Gerstel GM 1040 or this Kayaku Microchem XP KMPR 1005 or XP KMPR 1010 negative tone photopolymer is replaced by a higher viscosity solution such as the Microchem SU-8 2025 or SU-8 2050 or SU-8 2100, the Gerstel GM 1060, GM 1070 or GM 2060 or the Kayaku Microchem XP KMPR 1025, XP KMPR 1050 or XP KMPR-1100 negative tone photopolymer solution, then the optimized dose would be higher than about 180 mJ/cm$^2$, as to prevent under-exposure of this second layer of a negative tone photopolymer. To thicker negative tone photopolymer layers should also be associated a longer than 90 seconds post-exposure bake but still not exceeding 95° C.

FIG. 9E shows that this second layer of a preferably 10 um thick MicroChem SU-8 2005 negative tone photopolymer is developed using one of the two develop stations of the EV Group Hercules processor to define the defining the array of sidewalls of the array of microchannels. The regions of the photopolymer that have being exposed to the ultraviolet light passing through the openings of one or both of the masks remain intact because resistant to the chemical attack of the developer. These two layers of negative tone photopolymers are capable of achieving complex structures and mechanical features having a height:width aspect ratio as high as 10:1. Following suitable development of the photopolymer, the resulting photopolymer patterns are subjected to a post-develop bake at about 95° C. as to drive-off more of the residual solvents and the chemical by-products formed by the ultraviolet light exposure and by the develop. A vacuum bake at a temperature of about 180° C. is performed for about 2 hours to stabilize this exposed second 10 um thick layer. At this point, the developed and baked photopolymer patterns of the Device Wafer are ready to be aligned and to receive the transferred top photopolymer layer of the Carrier Wafer.

FIG. 10A shows that the Carrier Wafer supporting the developed and baked photopolymer patterns defining the array of covers of the array of microchannels is flipped-over and properly aligned to the Device Wafer integrating the array of sidewalls and the array of bottoms of the array of microchannels using the SmartView aligner of the EV Group Gemini processor. The alignment is precise within about 1 um. The aligned wafers, not yet in physical contact, are kept in position using a special fixture in preparation for loading of the pair of wafers into one of the four Universal bond chamber of the EV Group Gemini processor.

FIG. 10B shows that the pair of properly aligned wafers are loaded into one of the four Universal bond chamber of the EV Group Gemini processor. This Universal bond chamber allows the Carrier Wafer and the Device Wafer to become in physical contact by slowly pressing one against the other (without losing alignment accuracy) with a uniform force of 5 kN to 20 kN while heating the two wafers at a temperature of about 120-150° C. for about 20 minutes as to provoke the permanent bonding of the photopolymer of the CARRIER wafer to the exposed top bond material of the Device Wafer. Again, the precise alignment of about 1 um achieved with the SmartView is such that the thousands of protection capsules of the CARRIER wafer do not make a direct contact to the thousands of free-to-move mechanical devices of the Device Wafer during this bonding process. The bonded pair of wafers is unloaded from the Universal bond chamber, cooled-down to room temperature using a cool station and returned in a properly designed receiving cassette.

FIG. 10C shows that the two wafers are separated from each other. This is possible due to the hydrophobic nature of the SAM coating. This wafer separation can be performed using an EVG-850 DB wafer debonder.

FIG. 10D shows that the Device Wafer now incorporating the microchannel is heated under vacuum at more than 200° C. as to chemically stabilize the photopolymer and to achieve a solid permanent microchannel.

All references are herein incorporated by reference.

We claim:

1. A method of making a MEMS device comprising:
   forming a self-aligned monolayer (SAM) on a carrier wafer;
   forming a first polymer layer on said self-assembled monolayer;
   patterning said first polymer layer to form a microchannel cover;
   bonding said microchannel cover to a patterned second polymer layer on a device wafer to form microchannels;
   releasing said carrier wafer from the first polymer layer, and
   wherein said second polymer layer comprises first and second sublayers of polymer, said first sublayer is deposited first, said second sublayer is subsequently deposited on said first sublayer, and said second sublayer is then patterned to form sidewalls of the microchannels on the device wafer.

2. A method as claimed in claim 1, wherein the self-aligned monolayer is subjected to post-deposition treatment to perform cross-linking.

3. A method as claimed in claim 2, wherein the self-aligned monolayer is (Tridecafluoro-1,1,2,2-tetrahydrooctyl)trichlorosilane, $C_8H_4Cl_3F_{13}Si$.

4. A method as claimed in claim 2, wherein the self-aligned monolayer is selected from the group consisting of dimethyldichlorosilane, tridecafluoro-1, and heptadecafluoro-1,1,2,2-tetrahydrodecyltrichlorosilane.

5. A method as claimed in claim 2, wherein said first polymer layer is a photopolymer which is selectively exposed to radiation through a mask to define the microchannel cover.

6. A method as claimed in claim 5, wherein said photopolymer is a negative tone photopolymer.

7. A method as claimed in claim 1, wherein said first photopolymer layer is applied by spinning directly onto the self-aligned monolayer.

8. A method as claimed in claim 7, wherein said first polymer layer is about 20 μm thick.

9. A method as claimed in claim 5, wherein said first photopolymer layer is subjected to a pre-exposure bake not exceeding 95° C.

10. A method as claimed in claim 1, wherein each said sublayer comprises a negative tone photopolymer.

11. A method as claimed in claim 1, wherein said second sublayer is a photopolymer, and said second sublayer is exposed through a mask to form said sidewalls.

12. A method as claimed in claim 11, wherein after developing the second sublayer, said second sublayer is subjected to a vacuum bake at about 180° C.

13. A method as claimed in claim 1, wherein the carrier wafer and device wafer are bonded together by pressing them together into intimate contact at a temperature of 120-150° C. in a vacuum.

14. A method as claimed in claim 1, wherein the device wafer contains multiple CMOS drivers.

* * * * *